Aug. 16, 1966 D. L. SCHULTZ 3,267,333

MODULAR ELECTRONIC PACKAGE

Filed Feb. 28, 1964 2 Sheets-Sheet 1

INVENTOR.
DONALD L. SCHULTZ

BY George C. Sullivan
Agent

INVENTOR.
DONALD L. SCHULTZ
BY George C. Sullivan
Agent

United States Patent Office 3,267,333

Patented August 16, 1966

3,267,333

MODULAR ELECTRONIC PACKAGE

Donald L. Schultz, Dunellen, N.J., assignor to Lockheed Aircraft Corporation, Burbank, Calif.

Filed Feb. 28, 1964, Ser. No. 348,016
5 Claims. (Cl. 317—100)

Figure 1:
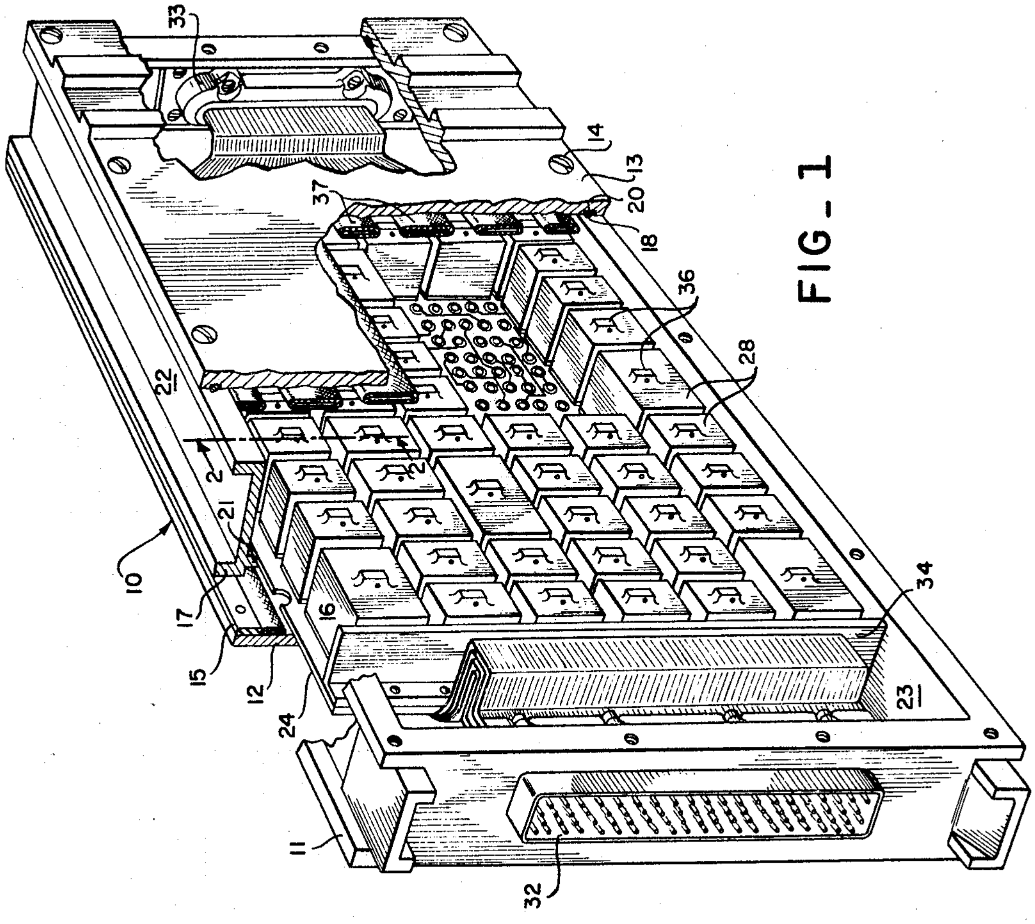

This invention relates generally to packaging of electronic components and more particularly to a modular electronic package utilizing printed circuits and component modules in a high density arrangement for convenient servicing and use under rugged environmental conditions.

Modular electronic units are, at the present time, an accepted approach to packaging in a large part of the electronics industry. Such units find use for example in complex computers and communications equipment where circuits may be physically divided into functional groups or sections and separately packaged for interchangeable interconnection with one another to form the desired composite circuit. The circuits themselves, as so housed, may include the usual components such as relays, counters, flip-flops, amplifiers, printed circuit boards and the like as necessary to perform the desired functions.

The advantages offered by modular packaging of electronic circuits over conventional packaging techniques are numerous, with space savings being in many cases of relatively minor importance. Modular packaging according to functional grouping in complex circuits greatly simplifies the maintenance and repair of electronic equipment. Malfunctions can be corrected by simply replacing suspect modular units by relatively unskilled and untrained personnel and without the use of special tools and equipment.

Where electronic circuits are packaged as modular units it is quite desirable to be able to conveniently replace defective components within each unit. Otherwise, failure of only one of a number of components in the unit would require replacement of the entire unit and greatly increase replacement parts costs. This high replacement parts cost is perhaps the main drawback heretofore in the use of modular packaging.

The modular electronic package of this invention permits the ready removal and replacement of individual circuit components in the unit. The individual components are themselves packaged in separate block or module form, and preferably encapsulated, for closely-spaced socket mounting on the board. To permit removal of the closely-spaced component modules, a special detent is provided on each module. The detents engage retention channels on the cover plate of the package housing. The retention channels are formed by flexible and somewhat resilient strips of woven wire which serve to both retain the component modules on the circuit board for good electrical continuity in a vibration environment and to efficiently conduct heat from the components to the outer wall of the modular electronic package where it may be dissipated. With electronic components which are closely spaced and confined, heat generated by the components themselves will drastically shorten their operating life unless that heat is conducted away from the component so as to avoid a temperature buildup. The construction disclosed herein is especially well suited to avoiding such temperature buildup while at the same time providing a modular electronic package which is readily accessible for repair and maintenance and which may be made extremely rugged and compact.

It is an object of this invention to provide a modular electronic package construction wherein its circuit components may themselves be modularized and socket mounted on a printed circuit board so as to be easily removed for maintenance and repair purposes.

Another object of this invention is to provide a modular electronic package having means for both efficiently dissipating internal heat and retaining the individual components firmly in position within the package even under rugged environmental conditions such as might be experienced, for example, in aircraft.

Another object of this invention is to provide a modular electronic package which is adaptable to automated fabrication and assembly techniques.

Still another object of this invention is to provide a modular electronic package wherein the circuit is readily adaptable to change through re-arrangement of components and circuit connections.

Further and other objects will become apparent from a reading of the following description, especially when considered together with the accompanying drawings wherein like numerals refer to like parts.

Figure 2:
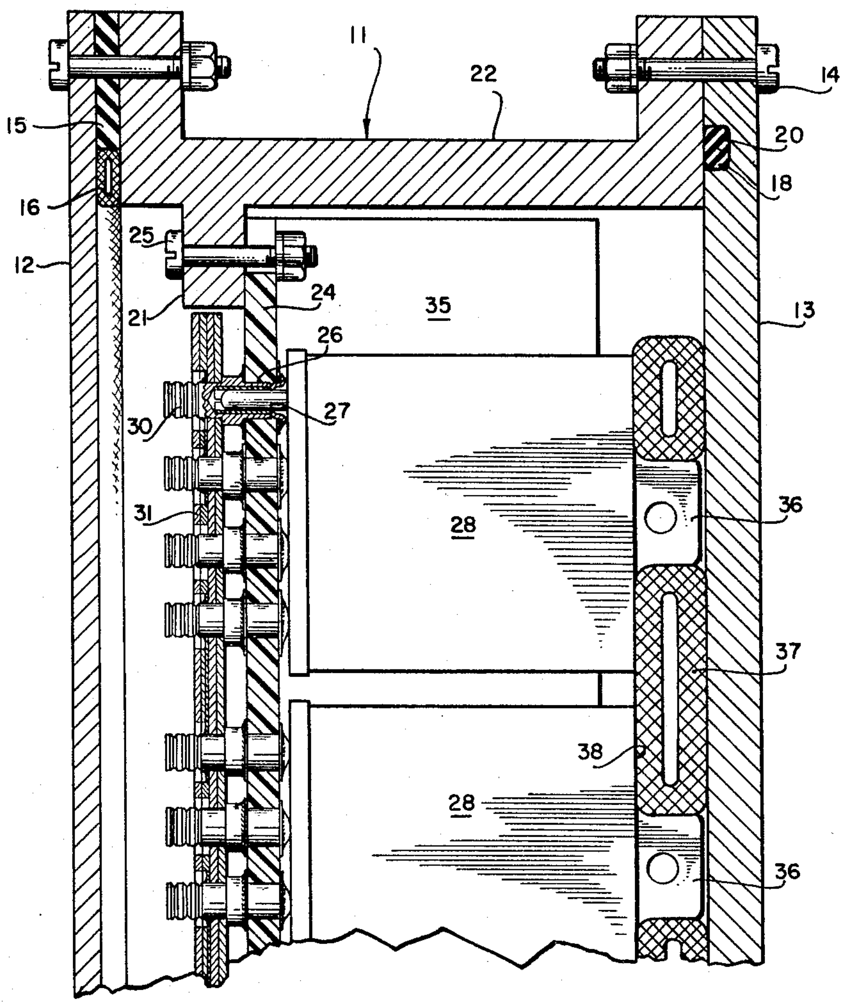

In the drawings:

FIGURE 1 is a fragmentary perspective view of the modular electronic package of this invention; and FIGURE 2 is a fragmentary sectional view taken on line 2—2 of FIGURE 1.

Referring to both FIGURES 1 and 2, housing 10 of the modular electronic package includes an open-sided generally rectangular frame 11 and a pair of cover plates 12 and 13 which are adapted to be secured to frame 11 by suitable means such as bolts 14 to form a sealed enclosure. Housing 10 is preferably of a material having good heat conductivity, rigidity and strength such as aluminum. One cover plate 12, sometimes referred to herein as the bottom cover plate, is held spaced from frame 11 by a sealing gasket 15. To provide good thermal conductivity from frame 11 to plate 12 a resilient wire mesh gasket 16 is employed in combination with sealing gasket 15 around the entire marginal edge of cover plate 12. The wire mesh gasket is squeezed between the cover plate and flange 17 on frame 11 when the cover plate is secured to the frame.

The other cover plate 13, sometimes referred to herein as the top cover plate, is seated directly on frame 11 and sealed at the mating surface by an O-ring gasket 18 carried in groove 20. Thus the housing forms an enclosure sealed from moisture and the like while at the same time providing a direct metal to metal path for conductive heat flow between frame 11 and both cover plates 12 and 13.

On walls 22 and 23 of frame 11 there is provided a flange 21 projecting inwardly of the housing adjacent to and generally parallel with bottom cover plate 12 to support the electronic components within the enclosure. A printed circuit board 24 of conventional construction, employing a stiff insulating core material with conductive film secured to its outer surfaces in accordance with specific circuit requirements, is bolted at 25 or otherwise suitably rigidly secured to flange 21 of frame 11. A plurality of sockets 26 are secured to board 24 and arranged in columns and rows to receive pins 27 of electronic component modules 28 and electrically couple the modules into the circuit. Each socket assembly 26 projects through board 24 to provide a stub 30 between the board and bottom cover plate 12 to which may be secured suitable wiring such as printed circuit cable 31 for feeding the input and output connectors such as 32 and 33 as shown in FIGURE 1. Printed circuit cable 31 connects desired socket assemblies 26 with the input and output leads of connectors 32 and 33.

To provide sufficient space for attaching the cable to the connectors 32 and 33 at each end of frame 11, and for other reasons as will later become apparent, the printed circuit board is made somewhat shorter than the frame and is provided with parting flanges 34 and 35 riveted or otherwise suitable secured to the two suspended edges of the printed circuit board to form a partition between the cable section and component module section of the package.

The electronic component modules 28 mounted on printed circuit board 24 through pins 27 and socket assemblies 26 are all of substantially the same height and are provided with top extraction detents 36 to which a tool (not shown) may be attached for removing the module from the package. The height extension of detent 36 on each component module in the package is preferably such as to leave at least a slight clearance between the module and the top cover plate 13 of the housing when the modules are properly seated in the printed circuit board sockets. Between the rows of detents 36 there is received heat conductive strips of resilient metal wire mesh 37 which are preferably secured to cover plate 13. Strips 37 firmly hold the modules in position in the package by pressing against module shoulders 38 between extraction detents 36, and thus serve to maintain good low resistance electrical connections between the modules and the printed circuit board. Equally important, strips 37 serve to conduct the heat generated by the component modules directly to cover plate 13, frame 11 and plate 12 of the housing. The housing having a comparatively large mass and surface area, serves as a heat sink and radiator to dissipate into the surrounding atmosphere the heat generated from within the package. These resilient wire mesh strips 37 run the length of the component section of the package and are spaced in rows so each will engage as large a surface area of each component module as possible.

Wire mesh strips 37 may be of any good heat conductive material which, when woven, will exhibit a degree of resiliency.

By rearranging component modules on the printed circuit board or by replacing the complete printed circuit board assembly, the unit may be quickly adapted to different circuit functions. At the same time, the mechanical coupling between the component modules and the housing provides reliable electrical continuity between the modules and the printed circuit board while the thermal coupling allows high density packaging of the modules without overheating.

The specific embodiment shown and described herein is for purposes of illustration and it is to be understood that certain alterations, modifications and substitutions may be made to the disclosure without departing from the teachings of the invention as defined by the spirit and scope of the appended claims.

What is claimed is:

1. A modular electronic package comprising, a generally rectangular open-sided frame, a pair of cover plates secured to the open sides of said frame and forming an enclosed housing, at least one of said plates being thermally conductive and removable from said frame for access inside said housing, a substantially rigid printed circuit board secured to said frame within the housing and forming a partition therein, a plurality of electronic component modules removably secured to said printed circuit board on one side thereof and electrically interconnected therewith to provide a useful circuit, a flexible printed circuit cable secured to said printed circuit board on the opposite side thereof and providing electrical input and output conductors for the circuit, and resilient woven metal heat conductive strips secured to said one plate and engaging said component modules to restrain the latter against movement and to transmit by conduction internally generated heat from the modules to said plate for dissipation of said heat exterior of the housing.

2. A device as defined in claim 1 including detents formed on said component modules which nest between adjacent conductive strips on said plate and provide means for extracting the modules.

3. A device as defined in claim 1 including a plurality of sockets formed in said printed circuit board, and pins on said component modules adapted to index with said sockets and be slidably received therein for electrically connecting the modules into the circuit.

4. A modular electronic package comprising, an open-sided metal frame, a pair of metal cover plates secured to the open sides of said frame to form an enclosed housing, at least one of said cover plates being spaced from said frame by an insulative sealing gasket and thermally coupled thereto by a resilient strip of woven wire, a substantially rigid printed circuit board secured to said frame within the housing and forming a partition therein, a plurality of rows of sockets carried on said printed circuit board and extending therethrough, a plurality of electronic component modules electrically engaging certain of said sockets on one side of said board to provide a useful circuit, flexible conductors engaging certain of said sockets on the opposite side of said printed circuit board to provide input and output leads for said circuit, and resilient woven metal heat conductive strips squeezed between a cover plate and said modules to restrain the latter against movement relative to said board and to transmit by conduction internally generated heat from the modules to said housing.

5. A modular electronic package comprising, a metal housing having a large opening formed therein, said housing including a metal cover plate removably secured to said housing over said opening, resilient sealing means interposed between said housing and cover plate and allowing metal to metal contact therebetween, a substantially rigid printed circuit board secured within the housing and forming a partition therein, a plurality of rows of sockets carried on said printed circuit board and extending therethrough, a plurality of electronic component modules electrically engaging certain of said sockets on one side of said board to provide a useful circuit, flexible conductors engaging certain of said sockets on the opposite side of said board to provide input and output leads for said circuit, and resilient metal strips squeezed between said housing and said modules to restrain the latter against movement relative to said board and to transmit by conduction internally generated heat from the modules to said housing.

References Cited by the Examiner

UNITED STATES PATENTS

| | | | |
|---|---|---|---|
| 2,755,079 | 7/1956 | York et al. | 174—35.2 X |
| 2,945,989 | 7/1960 | Vogel et al. | 317—101 |
| 2,974,183 | 3/1961 | Kes et al. | 174—35.2 |
| 3,202,869 | 8/1965 | Matson et al. | 317—100 |

ROBERT K. SCHAEFER, *Primary Examiner.*

KATHLEEN H. CLAFFY, *Examiner.*

J. J. BOSCO, *Assistant Examiner.*